United States Patent
Carlsson et al.

(10) Patent No.: US 8,018,284 B2
(45) Date of Patent: Sep. 13, 2011

(54) METHOD OF USING INTEGRATED POWER AMPLIFIER

(76) Inventors: Mats Carlsson, Sundbyberg (SE); Daniel Bjork, Sollentuna (SE)

(*) Notice: Subject to any disclaimer, the term of this patent is extended or adjusted under 35 U.S.C. 154(b) by 14 days.

(21) Appl. No.: 12/649,376

(22) Filed: Dec. 30, 2009

(65) Prior Publication Data
US 2011/0156818 A1    Jun. 30, 2011

(51) Int. Cl.
H03F 3/16    (2006.01)
(52) U.S. Cl. .................................. 330/277; 330/311
(58) Field of Classification Search .......... 330/310–311, 330/98, 133, 150, 302
See application file for complete search history.

(56) References Cited

U.S. PATENT DOCUMENTS

| | | | |
|---|---|---|---|
| 6,163,220 A | 12/2000 | Schellenberg | |
| 6,724,260 B2 | 4/2004 | Varner et al. | |
| 6,937,101 B2 | 8/2005 | Hageman et al. | |
| 7,113,033 B2 | 9/2006 | Barnett | |
| 7,459,977 B2 * | 12/2008 | Takahashi | 330/288 |

* cited by examiner

*Primary Examiner* — Hieu Nguyen
(74) *Attorney, Agent, or Firm* — Rolf Fasth; Fasth Law Offices

(57) ABSTRACT

An output-impedance in a power amplifier is provided. A first transistor $Q_{BUF}$ of a buffer stage is connected to a first side of a resistor $R_F$ and a second transistor $Q_{AMP}$ to a second opposite side of the resistor $R_F$. The first transistor feeds a current $I_{RF}$ to the second resistor $Q_{AMP}$. The current $I_{RF}$ at the second transistor is copied and multiplied by a factor (n) to form an output current $I_{OUT}$, as $(1+n)*I_{RF}$. The current $I_{RF}$ is fed back to the first transistor and the output current $I_{OUT}$ is fed to a load resistor R.

6 Claims, 3 Drawing Sheets

METHOD OF USING INTEGRATED POWER AMPLIFIER

TECHNICAL FIELD

The method relates to a method for designing integrated power amplifiers.

BACKGROUND OF INVENTION

In conventional power amplifier topologies linearity is often achieved by having large enough bias current in the transistor to ensure compliance to output requirements and specifications. This often results in the use of larger bias current than is required for supplying a certain output power to the load. This increases undesirable noise from the power amplifier. Another problem is that the transfer function from the input voltage to the output voltage is not linear due to the behavior of the transistor itself. This may provide undesirable signals. For example, the non-linear amplifier in a mobile telephone may produce signals in frequency bands that disturb other frequency bands. There is a need for a more effective and accurate power amplifier topology. Furthermore, the output impedance in conventional power amplifiers is dependant on the behavior of the output transistors which makes the output impedance inaccurate and constant only over a narrow frequency band.

SUMMARY OF INVENTION

The method of the present invention provides a solution to the above-outlined problems. More particularly, a constant and well defined output-impedance in a power amplifier is provided over a large frequency band. The output of a first transistor $Q_{BUF}$ of a buffer stage is connected to a first side of a resistor $R_F$ and the output of a second transistor $Q_{AMP}$ to a second opposite side of the resistor $R_F$. The current in the first transistor, $I_{RF}$, is copied and multiplied by a factor (n) in the second transistor to form an output current $I_{OUT}$ as $(1+n)*I_{RF}$. The current $I_{RF}$ is fed back to the first transistor and the output current $I_{OUT}$ is fed to a load resistor R.

DETAILED DESCRIPTION

Figure 1:
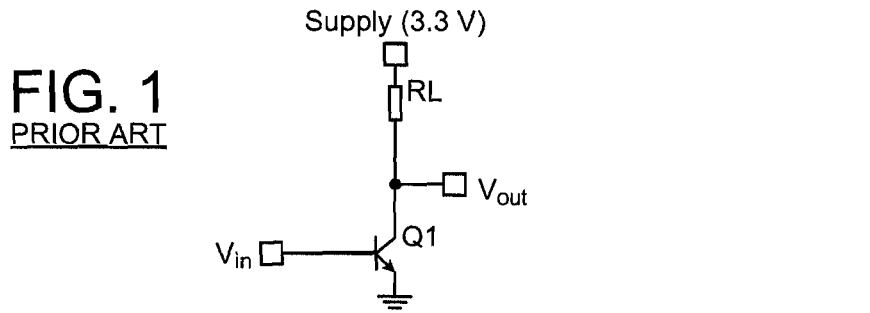
FIG. 1 is a block circuit diagram of a prior art power amplifier topology.

FIG. 1 is a block circuit diagram of a prior art power amplifier topology 10. The desired output impedance from the power amplifier is either defined by the pull-up impedance $R_L$ or by the size of the transistor $Q_1$ so that the base-collector capacitance and gain of the transistor $Q_1$ provide accurate output impedance. The pull-up impedance $R_L$ may be resistive, capacitive or inductive at the desired frequency band. The main two disadvantages of defining the output impedance in this way are reduced power added efficiency and difficulties in delivering output power over a wide frequency band. In other words, in order to deliver a certain power for a given resistor $R_L$, half of the power is lost so that twice as much current must be used to achieve the desired power to the load.

Figure 2:
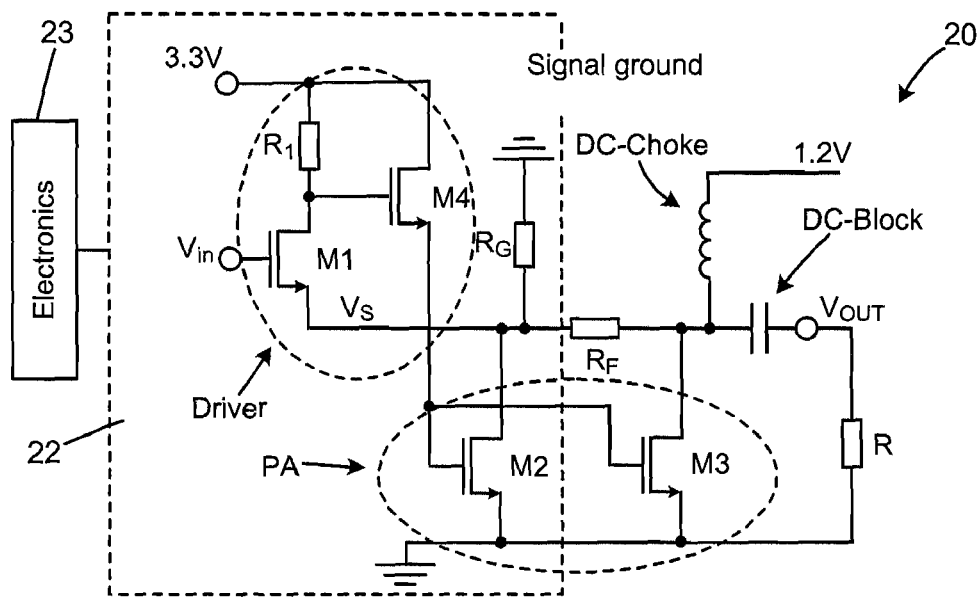
FIG. 2 is a block circuit diagram of a first embodiment of the power amplifier topology of the present invention.

FIG. 2 is a block circuit diagram of a first embodiment of the present invention of an output stage system 20 that is suitable for a power amplifier operating at radio frequencies. The system 20 has a buffer stage 22. One function of the buffer stage 22 is to buffer the voltage input $V_{IN}$ to the voltage source $V_S$ of the transistor $M_1$ so that the voltage source $V_S$ is, for example, identical to the voltage input $V_{IN}$. In this way, any electronics 23 prior to the output stage system 20 is buffered to make sure the prior electronics are able to drive the load resistance at the output stage and to make sure the desirable power is delivered. A direct connection of the prior electronics to the load, without the buffer, drastically reduces the power delivered and the functionality of the prior electronics may be compromised or even destroyed. The buffer stage 22 connected to a feedback resistor $R_F$ that, preferably but not necessarily, may be larger than the load resistor R at the output. The current $I_{RF}$ that goes through the transistor $M_2$ to transistor $M_3$ is copied. This current is then amplified with a factor (n) so that the outgoing current $I_{OUT}$ taken from the power amplifier at $V_{OUT}$ is a factor (n+1) greater than the current $I_{RF}$ that goes through $R_F$. Any power loss in the resistor $R_F$ should, preferably, be less than if a serially connected resistor of the same size as the load resistor was used.

The power amplifier topology of the present invention has a feedback system that provides effective linearization, impedance matching and noise suppression. The improved linearization of the feedback system thus avoids undesirable signals in other frequency bands. The design of the topology of the present invention makes it possible to achieve high performance for low current consumption. The topology also provides good output power over a large frequency range. The input stage $M_1$ is a source follower since the voltage source $V_S$ of the transistor $M_1$ follows the voltage input $V_{IN}$. The input stage $M_1$ has been improved by applying feedback stages such as transistors $M_2$ and $M_4$. The input stage $M_1$ provides high input impedance and the source voltage of the input stage follows the input voltage $V_{IN}$ at the gate of input stage $M_1$. Preferably, the input stage $M_1$ is loaded by a resistor $R_G$ and a resistor $R_F$. The load current is, due to the feedback around the input stage $M_1$, supplied by the transistor $M_2$. The current in transistor $M_2$ is then amplified by a factor (n), when a transistor $M_3$ is a factor (n) larger than transistor $M_2$, into transistor $M_3$ to provide current gain to the output. The feedback resistor $R_F$ and the factor (n) may thus be used to determine the output impedance $R_{OUT}$ of the output stage 20. As indicated above, this output impedance should match the impedance of the load resistor R.

The output impedance $R_{OUT}$ may be calculated according to equation (1) below:

$$R_{OUT}=R_F/(n+1) \tag{1}$$

An accurate output matching over a wide frequency band may be accomplished by proper selection of the resistor $R_F$ and the factor (n). As explained in more detail below, the resistor $R_G$ may be used to increase the voltage gain from the input to the output. The feedback around the input stage $M_1$ forces the node or source voltage $V_S$ to be equal to the voltage input $V_{IN}$.

Due to the resistor $R_G$, the current to the transistor $M_2$ is increased and a better voltage gain may be accomplished so that a higher output power may be provided to the load resistance without affecting the output impedance of the power amplifier. In other, words, one function of resistor $R_G$ is to increase the current that goes down to transistor $M_2$ and thus the current that goes to transistor $M_3$ and this increases the voltage $V_{OUT}$. As a result, the significance of the amplification by the factor (n) is increased. Thus, the resistor $R_G$ is an extra load on the buffer stage which increases the output power that may be fed to the load resistor R without affecting the output impedance of the power amplifier.

A direct current (DC) bias may be supplied by a DC choke or by a current source that is integrated on the chip. The load may be connected to the output via a DC blocking capacitor. The DC choke may be used so that DC can be supplied to the transistor $M_3$ and so that it is not necessary to feed the current to transistor $M_3$ via a resistor. The DC block may be used to prevent DC voltage from being fed to the load resistor R and so that only AC is permitted to pass through the DC block to feed the resistor R.

There are two feedback loops. A first feedback loop may be around the input stage $M_1$ by using the transistors $M_2$ and $M_4$, as discussed above, to provide the buffer. The drain of transistor $M_1$ is connected to a resistor $R_1$ and transistor $M_4$ feeds current down to transistor $M_2$. The drain of transistor $M_2$ is connected back to the source $V_S$.

A second feedback loop may be around the output stage, including the transistors $M_2$ and $M_3$ and the resistor $R_F$ so that current flows via the drain of transistor $M_3$ through the resistor $R_F$. Both feedbacks loops suppress noise and distortion that arise from the active components. The noise performance and linearity are thus improved compared to conventional power amplifier topologies that do not have feedback loops.

Figure 3:
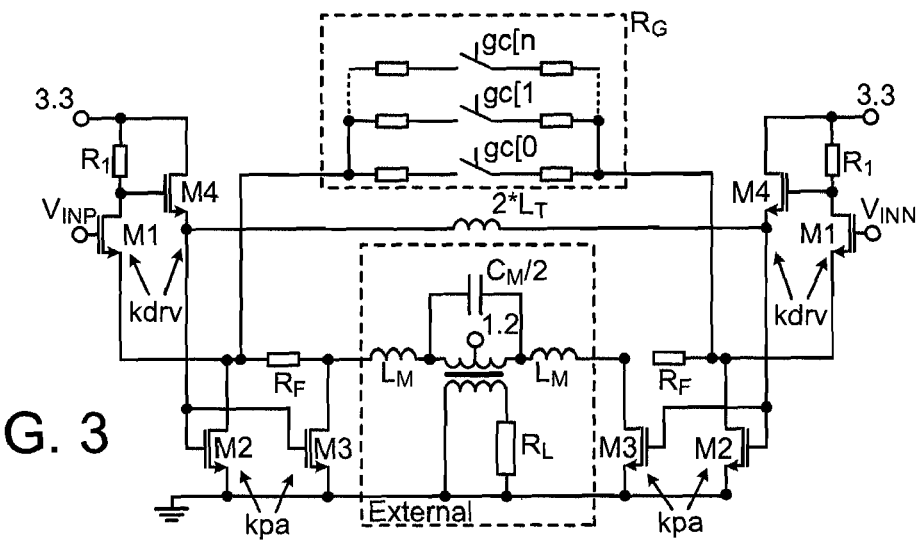
FIG. 3 is a block circuit diagram of a second embodiment of the power amplifier topology of the present invention.

The output stage of the present invention may also be implemented either as single ended or as differential and so that different output powers may easily be accomplished. FIG. 3 is a block circuit diagram of a differential implementation of the output stage 30 and the view also shows how the power amplifier may be programmed. The resistor $R_G$ may be programmable to gain better control of the output power. The maximum gain may be achieved when the resistor $R_G$ is low. The lower the gain setting is the lower the drive requirements of the transistor network are. The input voltage $V_{INP}$ operates at a phase that is opposite a phase of the input voltage $V_{INN}$. The current that goes through the load (indicated as external) does not go to ground but back and forth between the two outputs. The external resistor may include transformers that convert from differential back to single ended. To save DC power the number of parallel devices in transistors $M_1$-$M_4$ may be scalable. $K_{pa}$ sets the number of parallel devices in transistors $M_2$ and $M_3$. $K_{drv}$ sets the number of parallel devices of $M_1$ and $M_4$. $K_{pa}$ corresponds to the factor (n) in FIG. 2.

Figure 4:
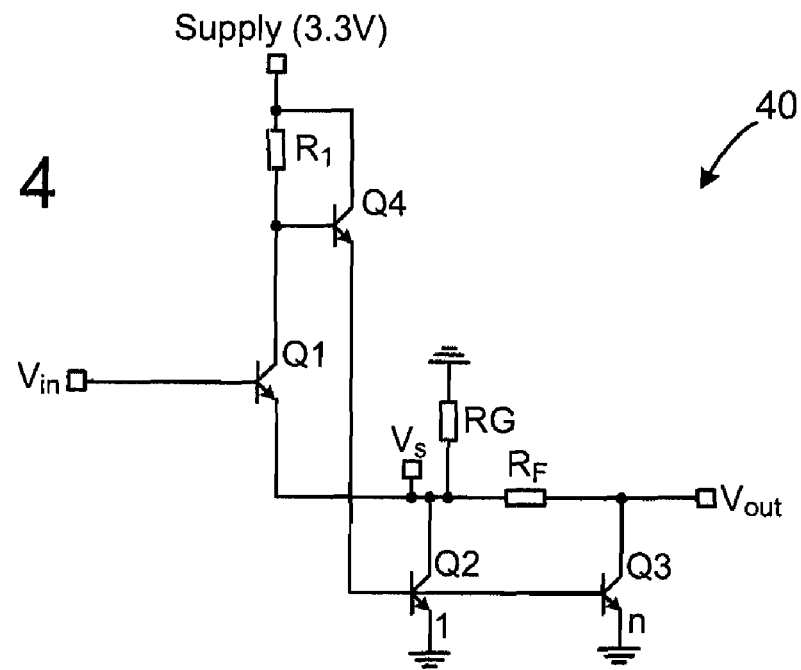
FIG. 4 is a block circuit diagram of a third embodiment of the power amplifier topology of the present invention.
Figure 5:
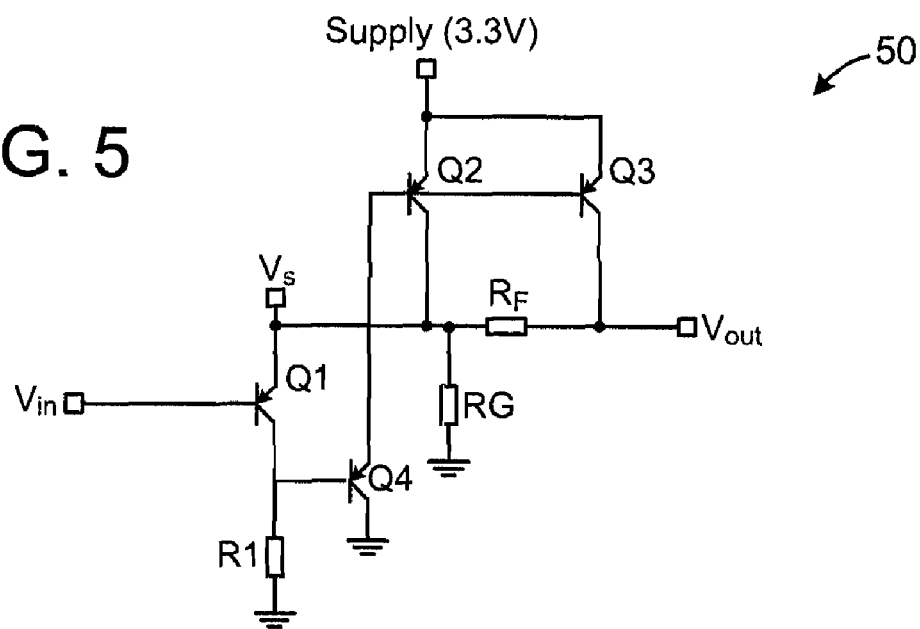
FIG. 5 is a block circuit diagram of a fourth embodiment of the power amplifier topology of the present invention.

The output stage of the present invention may also be implemented in bipolar technologies. A bipolar version 40 of the power amplifier is shown in FIG. 4. Basically, the version in FIG. 4 is very similar to the embodiment shown in FIG. 2 except that the transistors have been replaced by bipolar transistors. A bipolar PNP (positive-negative-positive) version 50 of the power amplifier is shown in FIG. 5. The transistors in FIG. 2 have been replaced by bipolar PNP transistors. An alternative embodiment of the invention can be formed by replacing the PNP transistors in FIG. 5 by PMOS transistors.

Figure 6:
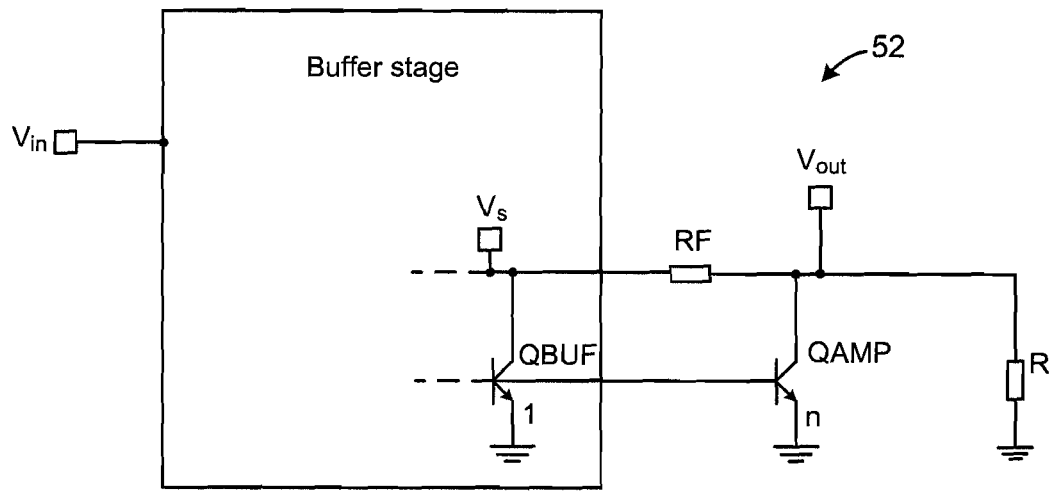
FIG. 6 is a summary block diagram of the present invention.

FIG. 6 is an overall block diagram 52 that illustrates the principles of the present invention. The diagram 52 shows a buffer stage including voltage input $V_{IN}$ and source voltage $V_S$. The buffer stage also includes a transistor $Q_{BUF}$ connected to a transistor $Q_{AMP}$ in a power amplifier step.

The source voltage $V_S$ is buffered in the buffer stage to match the input voltage $V_{IN}$. The transistor $Q_{AMP}$ is loaded by the load resistor or impedance R. The current $I_{RF}$ that is driven into the impedance $R_F$ is supplied by the output stage i.e. transistor $Q_{BUF}$. The current from transistor $Q_{BUF}$ to transistor $Q_{AMP}$ is copied and multiplied by the factor (n), which may be any number and not necessarily an integer or a number greater than one, to another transistor of the same type, i.e. the transistor $Q_{BUF}$, of the output stage. The transistor $Q_{AMP}$ is connected to one side of the feedback impedance $R_F$ and the transistor $Q_{BUF}$ is connected to the other opposite side of the feedback impedance $R_F$. The total current taken from the power amplifier output is then $I_{RF}$ plus $n*I_{RF}$. Thus, the output impedance may be defined by the factor n and the impedance $R_F$ which provides accurate output impedance.

Figure 7:
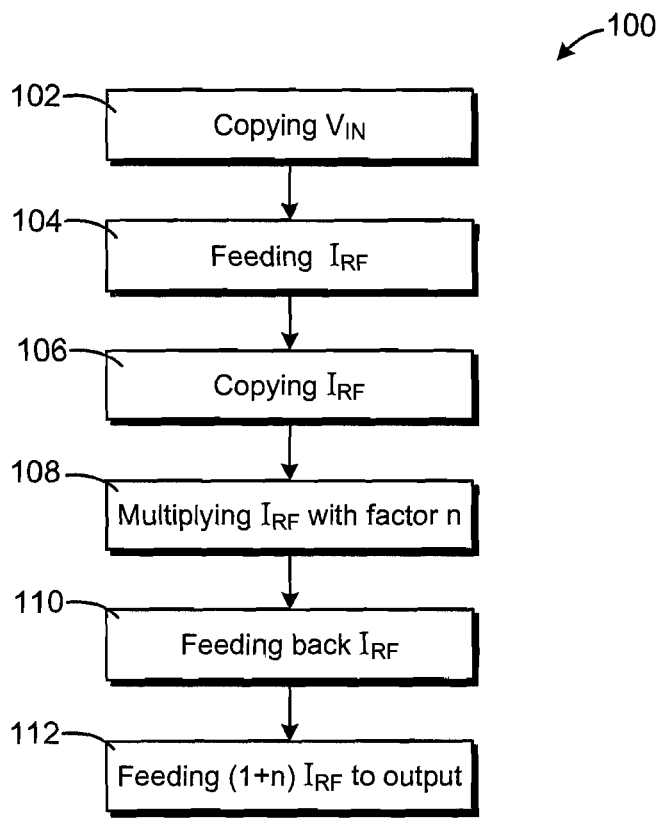
FIG. 7 is a schematic summary view of the steps of the method of the present invention.

Some of the important steps of the method 100 of the present invention are summarized in FIG. 7. In a copying step 102 of a buffer stage, the source voltage $V_S$ is adapted and matched to the voltage input $V_{IN}$. A transistor in the buffer stage feeds a current $I_{RF}$ in a feeding step 104 to a second transistor that is outside the buffer stage. The current $I_{RF}$ is copied in a copying step 106 and multiplied by a factor (n) at the second transistor in a multiplying step 108. The current $I_{RF}$ is fed, in a feeding step 110, over a feedback impedance $R_F$ back into the first transistor in the buffer stage. The current $I_{OUT}$ is fed, in a feeding step 112, to the output.

While the present invention has been described in accordance with preferred compositions and embodiments, it is to be understood that certain substitutions and alterations may be made thereto without departing from the spirit and scope of the following claims.

The invention claimed is:

1. A method for providing an output-impedance in a power amplifier, comprising:
    connecting a first transistor ($Q_{BUF}$) on a first side of a impedance ($R_F$) and a second transistor ($Q_{AMP}$) to a second opposite side of the impedance ($R_F$),
    the first transistor feeding a current ($I_{RF}$) to the impedance ($R_F$),
    copying the current ($I_{RF}$) at the second transistor,
    multiplying the current with a factor (n) to form an output current ($I_{OUT}$), as $(1+n)*(I_{RF})$,
    feeding back the current ($I_{RF}$) to the first transistor,
    feeding the output current ($I_{OUT}$) to a load resistor (R), and
    using an additional impedance ($R_G$) to load a buffer stage and increasing the output power without affecting any output impedance of the power amplifier.

2. The method according to claim 1 wherein the method further comprises providing a buffer stage having the first transistor $Q_{BUF}$.

3. The method according to claim 2 wherein the method further comprises buffering an input voltage ($V_{IN}$) to a source voltage VS in the buffer stage.

4. The method according to claim 1 wherein the method further comprises feeding back the current ($I_{RF}$) via the impedance ($R_F$) to a buffer stage.

5. The method according to claim 1 wherein the method further comprises using a DC block to prevent direct current voltage from being fed to the load resistor (R).

6. The method according to claim 1 wherein the method further comprises programming the additional impedance ($R_G$) to gain control of an output power of the output stage.

* * * * *